(12) United States Patent
Itakura et al.

(10) Patent No.: US 11,949,257 B2
(45) Date of Patent: Apr. 2, 2024

(54) MANAGEMENT DEVICE AND POWER SUPPLY SYSTEM

(71) Applicant: Panasonic Intellectual Property Management Co., Ltd., Osaka (JP)

(72) Inventors: Yusuke Itakura, Nara (JP); Changhui Yang, Osaka (JP); Shinya Nishikawa, Osaka (JP); Tohru Watanabe, Gifu (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 600 days.

(21) Appl. No.: 17/261,058

(22) PCT Filed: Jun. 12, 2019

(86) PCT No.: PCT/JP2019/023182
§ 371 (c)(1),
(2) Date: Jan. 18, 2021

(87) PCT Pub. No.: WO2020/021889
PCT Pub. Date: Jan. 30, 2020

(65) Prior Publication Data
US 2021/0296911 A1 Sep. 23, 2021

(30) Foreign Application Priority Data
Jul. 25, 2018 (JP) .................. 2018-139367

(51) Int. Cl.
*H02J 7/00* (2006.01)
*B60L 58/22* (2019.01)
(Continued)

(52) U.S. Cl.
CPC ............ *H02J 7/0016* (2013.01); *B60L 58/22* (2019.02); *B60L 58/24* (2019.02);
(Continued)

(58) Field of Classification Search
CPC .......................... H02J 7/0016; G01R 31/3835
(Continued)

(56) References Cited

U.S. PATENT DOCUMENTS 9,925,888 B2 * 3/2018 Chang ................... B60L 50/66
2013/0106356 A1 * 5/2013 Nakao .................. H01M 10/48
320/118
(Continued)

FOREIGN PATENT DOCUMENTS

JP 2013-117410 6/2013

OTHER PUBLICATIONS

International Search Report of PCT application No. PCT/JP2019/023182 dated Jul. 30, 2019.

*Primary Examiner* — Eric D Lee
(74) *Attorney, Agent, or Firm* — Rimon P.C.

(57) ABSTRACT

A controller executes an equalization process of equalizing capacities of a plurality of cells, and a cell abnormality determination process of, of detected voltages of the plurality of cells, calculating a voltage difference between a representative voltage based on the detected voltage of at least one cell to be compared and the detected voltage of one cell to be detected at a first time and a second time, and when a difference between the two voltage differences is greater than or equal to a threshold value, determining that the cell to be detected is abnormal. In the case of executing the cell abnormality determination process during the equalization process, the controller provides the detected voltage of a target cell to be subjected to the equalization process with a compensation value corresponding to a voltage change based on energy transfer in the target cell due to the equalization process between the first time and the second time, and calculates the voltage difference at the second time.

6 Claims, 10 Drawing Sheets

(51) Int. Cl.
*B60L 58/24* (2019.01)
*G01R 31/3835* (2019.01)
*H01M 10/48* (2006.01)
*H01M 10/42* (2006.01)

(52) U.S. Cl.
CPC ........ *G01R 31/3835* (2019.01); *H01M 10/48* (2013.01); *H02J 7/0048* (2020.01); *B60L 2240/427* (2013.01); *H01M 2010/4271* (2013.01)

(58) Field of Classification Search
USPC ........................................................ 320/118
See application file for complete search history.

(56) References Cited

U.S. PATENT DOCUMENTS

| | | | | |
|---|---|---|---|---|
| 2014/0042973 A1* | 2/2014 | Kawahara | ................ | H02J 5/00 320/118 |
| 2020/0326378 A1* | 10/2020 | Oono | .................... | H01M 10/06 |

\* cited by examiner

FIG. 1
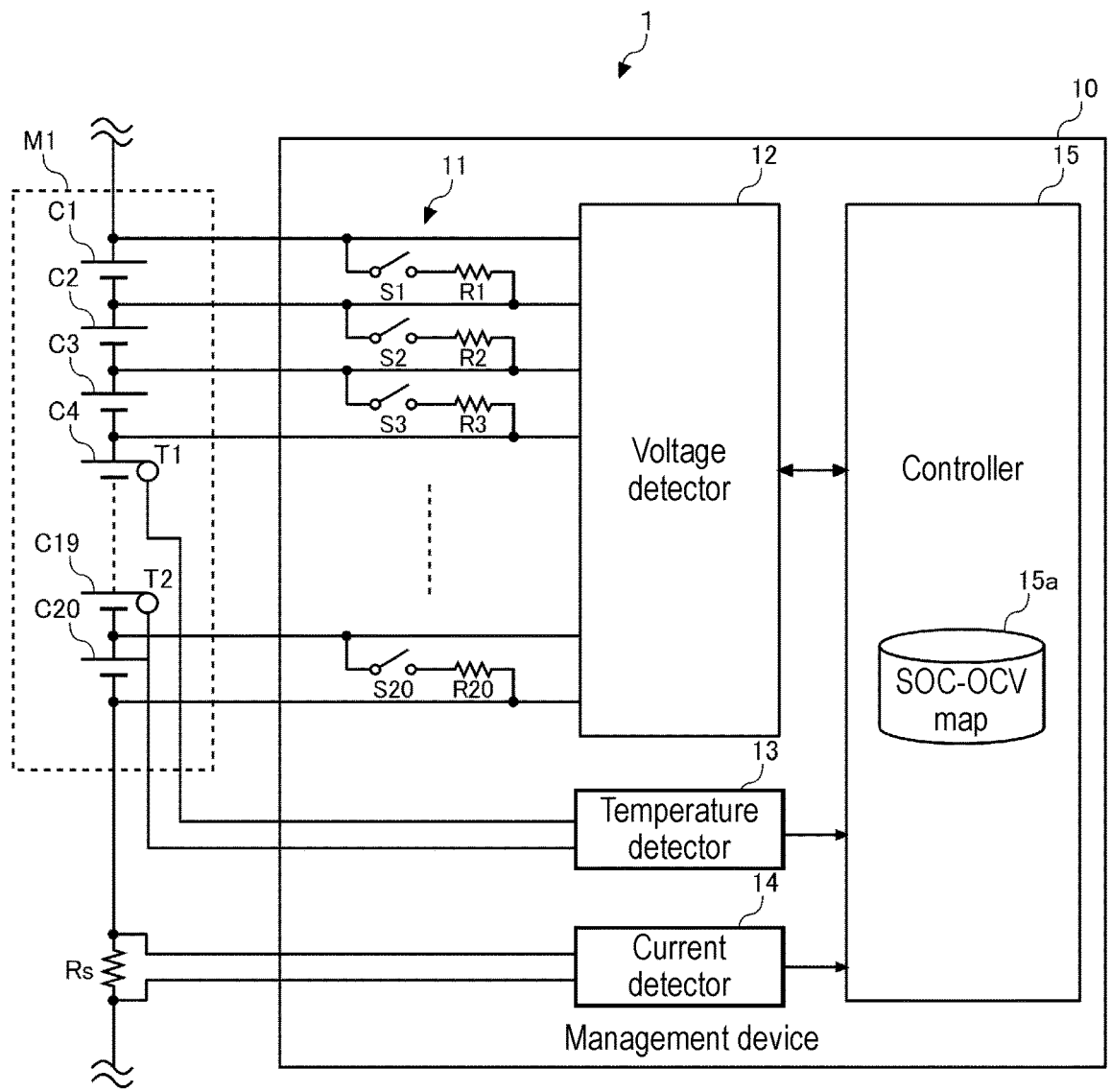
FIG. 2
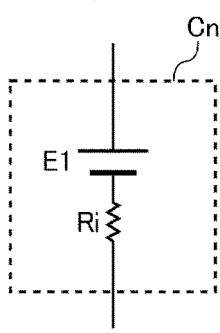
Normal cell
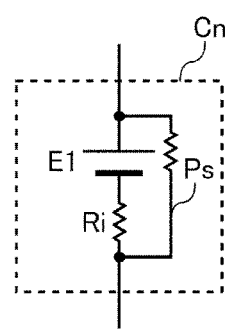
Minute short-circuited cell FIG. 5
(a) 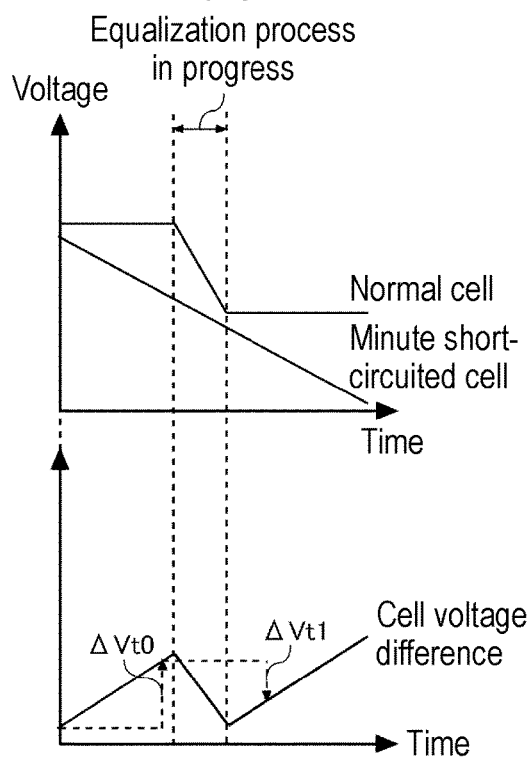
(b) 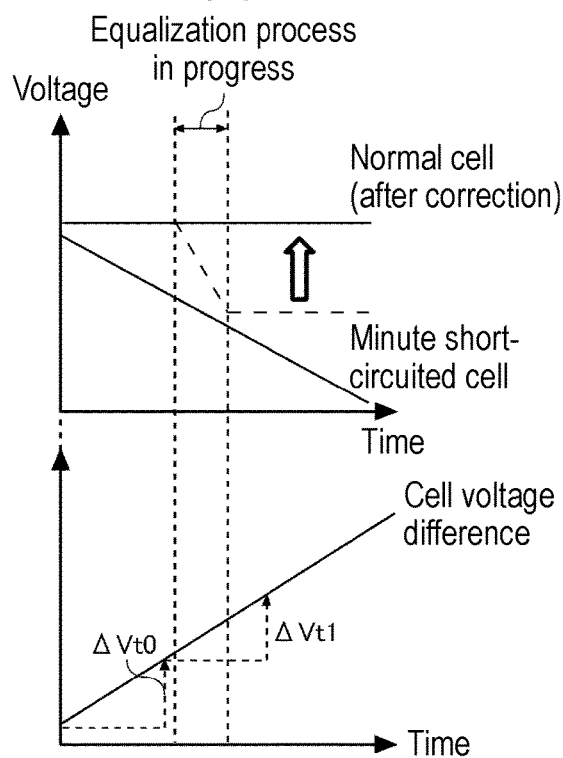
FIG. 6
(a) 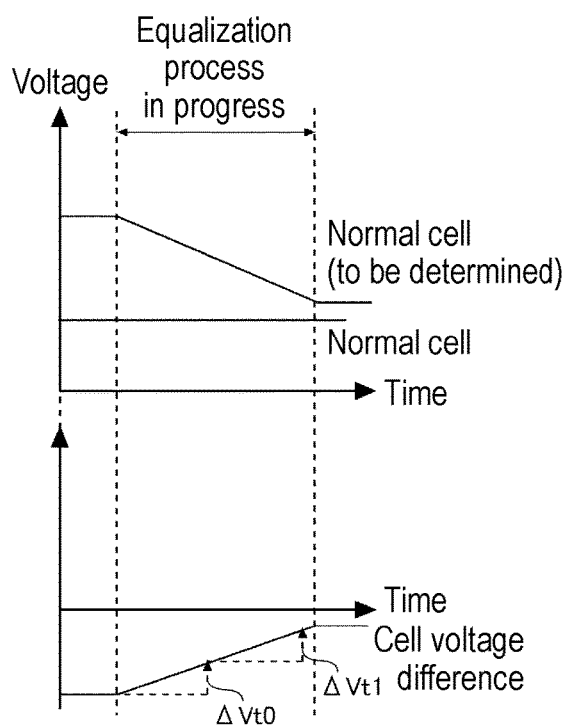
(b) 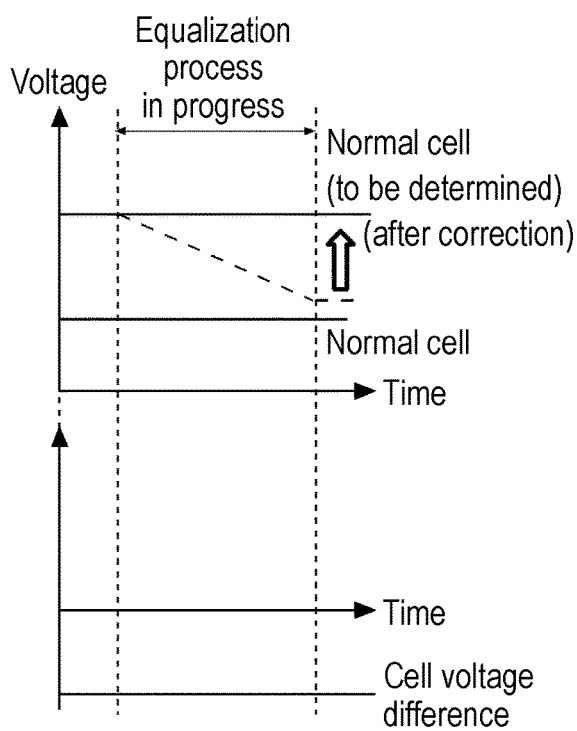

MANAGEMENT DEVICE AND POWER SUPPLY SYSTEM

CROSS-REFERENCE TO RELATED APPLICATIONS

This application is a U.S. national stage application of the PCT International Application No. PCT/JP2019/023182 filed on Jun. 12, 2019, which claims the benefit of foreign priority of Japanese patent application No. 2018-139367, filed on Jul. 25, 2018, the contents all of which are incorporated herein by reference.

TECHNICAL FIELD

The present invention relates to a management device for managing a plurality of cells included in a power storage module, and a power supply system.

BACKGROUND ART

In recent years, secondary batteries such as lithium ion batteries and nickel hydrogen batteries have been used for various purposes. For example, secondary batteries are used in vehicles (including electric bicycles) for the purpose of supplying power to driving motors in electric vehicles (EVs), hybrid electric vehicles (HEVs), and plug-in hybrid vehicles (PHVs), in power storage for the purpose of peak shift and backup, in frequency regulation (FR) for the purpose of stabilizing the frequency of a system, and the like.

Generally, in a lithium ion battery, an equalization process of equalizing capacity among a plurality of cells connected in series is executed from the viewpoint of maintaining power efficiency and ensuring safety. The equalization process is performed mainly by a passive method. In the passive method, discharge resistances are connected to the plurality of cells connected in series, and the cells other than the cell under the lowest voltage are discharged such that the voltages of the other cells match the voltage of the cell under the lowest voltage.

In a secondary battery such as a lithium-ion battery, a minute short circuit may occur in the battery due to contact between the positive electrode and the negative electrode due to displacement of the separator, generation of an electrically conductive path due to foreign matter mixed in the battery, and the like. The minute short circuit causes overheating, and the state of minute short circuit may shift to the state of dead short circuit due to a change in the orientation of foreign matter or the like.

As a method for detecting a minute short circuit, there is a method for determining a target cell as abnormal when the voltage difference between the average voltage of all cells in the assembled battery and the voltage of each cell is continuously increasing. However, during the equalization process, the cell discharge prevents the expansion of the voltage difference. Depending on the magnitude of the discharge current during the equalization process, all the expansion of the voltage difference due to the minute short circuit may be canceled out, so that the minute short circuit may not be detected.

It is difficult to distinguish between the cell voltage drop caused by energy transfer in the equalization process and the cell voltage drop caused by the minute short circuit, and it is common to stop the minute short circuit detection process during the equalization process.

To handle this, there has been proposed a method for determining that a minute short circuit has occurred when the quantity of change in the capacity adjustment (equalization) time is larger than a threshold value indicating a minute short circuit before and after an idle period of a detection device that detects abnormality in cells. That is, in the period during which the detection device is idle, it is not possible to integrate the charge/discharge current or detect abnormality in cells that might occur during the idle period. Therefore, according to this method, abnormality is determined depending on whether the quantity of change in the capacity adjustment time before and after the idle state has exceeded the threshold value (see, for example, PTL 1).

CITATION LIST

Patent Literature

PTL 1: Unexamined Japanese Patent Publication No. 2013-117410

SUMMARY OF THE INVENTION

Technical Problem

However, since the capacity adjustment time by the equalization process is used, the timing of performing abnormality determination is limited to be after the equalization process, and the timing of abnormality determination is delayed. Therefore, it takes time from the occurrence of an abnormality in a cell to the detection of the abnormality. In addition, a dedicated arithmetic operation is required to detect a minute short circuit during the idle period, where an abnormality is determined by a process different from the determination in the non-idle period. This increases a number of parameters and the quantity of calculation, which leads to complexity.

The present invention has been made in view of such circumstances, and an object of the present invention is to provide a technique capable of determining abnormality in cells with high accuracy using a common determination standard regardless of whether the equalization process is in progress.

Solution to Problem

In order to solve the above problems, a management device characterized by an aspect of the present invention includes: a voltage detector that detects respective voltages of a plurality of cells connected in series; and a controller that executes (1) an equalization process of equalizing capacities of the plurality of cells based on the detected voltages of the plurality of cells and (2) a cell abnormality determination process of, of the detected voltages of the plurality of cells, calculating a voltage difference between a representative voltage based on the detected voltage of at least one cell to be compared and the detected voltage of one cell to be detected at a first time and a second time, and when a difference between the two voltage differences is greater than or equal to a threshold value, determining that the cell to be detected is abnormal. In the case of executing the cell abnormality determination process during the equalization process, the controller provides the detected voltage of a target cell to be subjected to the equalization process with a compensation value corresponding to a voltage change based on energy transfer in the target cell due to the equalization process between the first time and the second time, and calculates the voltage difference at the second time.

Advantageous Effect of Invention

According to the present invention, abnormality in cells can be determined with high accuracy using a common determination standard regardless of whether the equalization process is in progress.

BRIEF DESCRIPTION OF DRAWINGS

FIG. 1 is a diagram for explaining a power supply system according to an exemplary embodiment of the present invention.

FIGS. 2(a) and 2(b) are diagrams showing a comparison between a normal cell and a minute short-circuited cell.

FIGS. 5(a) and 5(b) are diagrams showing a first example in which an equalization process and a minute short circuit detection process compete with each other.

FIGS. 6(a) and 6(b) are diagrams showing a second example in which an equalization process and a minute short circuit detection process compete with each other.

DESCRIPTION OF EMBODIMENT

Figure 3:
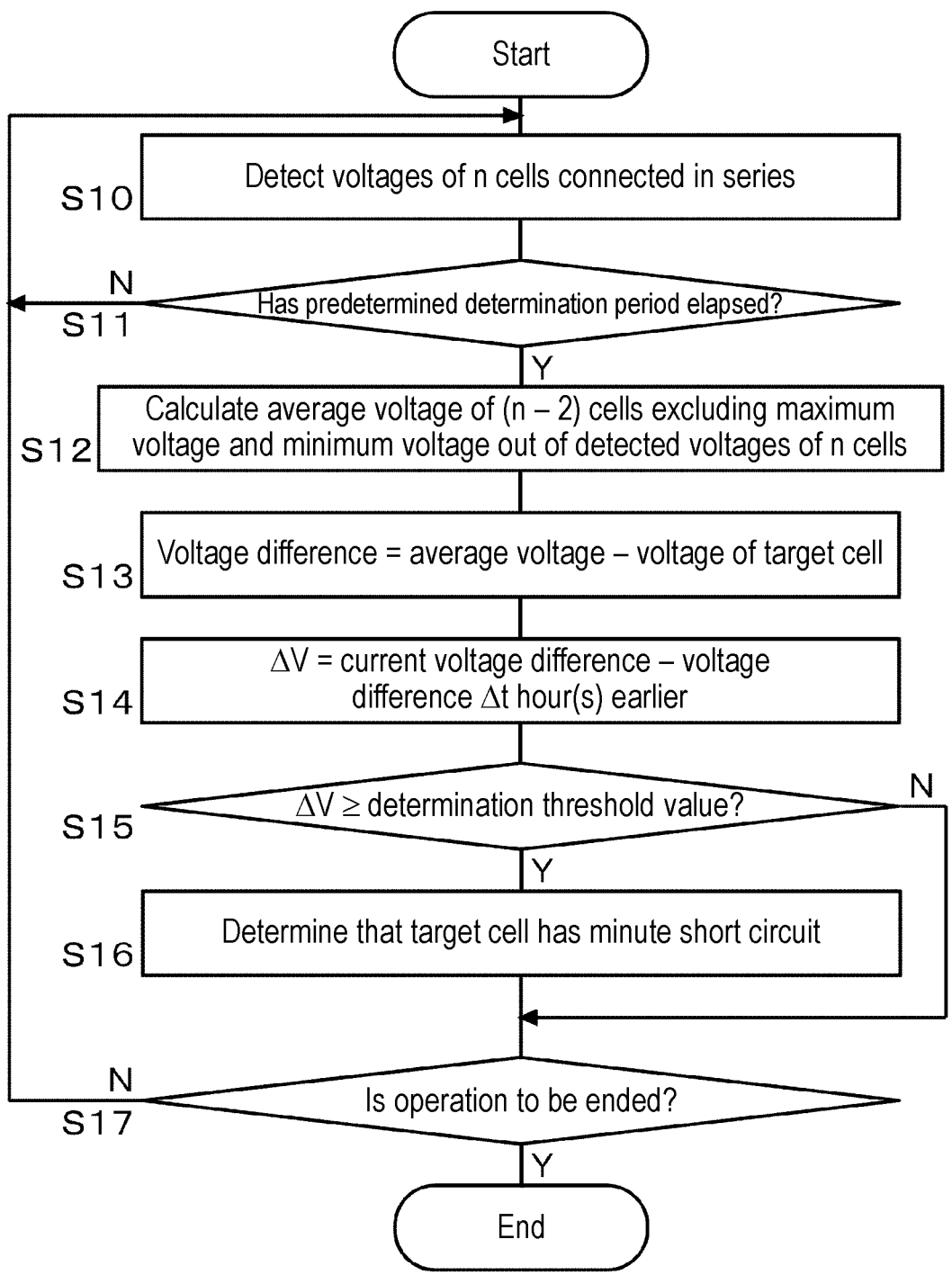
FIG. 3 is a flowchart showing a first reference example of a method for detecting a minute short circuit by a management device according to the exemplary embodiment of the present invention.

FIG. 1 is a diagram for explaining power supply system 1 according to an exemplary embodiment of the present invention. Power supply system 1 is mounted on a vehicle and used as, for example, a battery for driving the vehicle. Power supply system 1 includes power storage module M1 and management device 10. Power storage module M1 includes a plurality of cells C1 to C20 connected in series. FIG. 1 depicts an example in which twenty cells C1 to C20 are connected in series to form one power storage module. As the cells, lithium ion battery cells, nickel hydrogen battery cells, lead battery cells, electric double layer capacitor cells, lithium ion capacitor cells, or the like can be used. Hereinafter, in the present specification, an example using lithium ion battery cells (nominal voltage: 3.6 V to 3.7 V) is assumed.

Management device 10 includes discharger 11, voltage detector 12, temperature detector 13, current detector 14, and controller 15. Discharger 11 includes a plurality of discharge switches S1 to S20 and a plurality of discharge resistances R1 to R20. Discharge circuits are connected in parallel to cells C1 to C20. Specifically, first discharge switch S1 and first discharge resistance R1 are connected in series to both ends of first cell C1, second discharge switch S2 and second discharge resistance R2 are connected in series to both ends of second cell C2, third discharge switch S3 and third discharge resistance R3 are connected in series to both ends of third cell C3, . . . , 19th discharge switch and 19th discharge resistance (not shown) are connected in series to both ends of 19th cell C19 (not shown), and 20th discharge switch S20 and 20th discharge resistance R20 are connected to both ends of 20th cell C20.

Voltage detector 12 is connected to nodes of the plurality of cells C1 to C20 connected in series by a plurality of voltage lines, and detects a voltage between two adjacent voltage lines to detect voltages of cells C1 to C20. Voltage detector 12 transmits the detected voltages of cells C1 to C20 to controller 15.

Since voltage detector 12 has a high voltage with respect to controller 15, voltage detector 12 and controller 15 are connected by a communication line in an insulated state. Voltage detector 12 can be configured with an application specific integrated circuit (ASIC) or a general-purpose analog front-end IC. Voltage detector 12 includes a multiplexer and an analog-to-digital (A/D) converter. The multiplexer outputs the voltage between two adjacent voltage lines to the A/D converter in order from the top. The A/D converter converts the analog voltages input from the multiplexer into digital values.

Temperature detector 13 includes a voltage dividing resistor and an A/D converter. The A/D converter sequentially converts a plurality of analog voltages divided by a plurality of temperature sensors T1 and T2 (for example, thermistors) and a plurality of voltage dividing resistors into digital values and outputs the values to controller 15. Controller 15 estimates the temperatures of the plurality of cells C1 to C20 based on the digital values. For example, controller 15 estimates the temperatures of cells C1 to C20 based on the values detected by the temperature sensors closest to cells C1 to C20.

Current detector 14 includes a differential amplifier and an A/D converter. The differential amplifier amplifies a voltage across shunt resistor Rs and outputs the voltage to the A/D converter. The A/D converter converts the voltage input from the differential amplifier into a digital value and outputs the value to controller 15. Controller 15 estimates currents flowing through the plurality of cells C1 to C20 based on the digital value. A Hall element may be used instead of shunt resistor Rs.

If an A/D converter is mounted in controller 15 and an analog input port is provided in controller 15, temperature detector 13 and current detector 14 may output the analog voltages to controller 15 so that the analog voltages are converted into digital values by the A/D converter in controller 15.

Controller 15 manages states of the plurality of cells C1 to C20 based on the voltages, temperatures, and currents of the plurality of cells C1 to C20 detected by voltage detector 12, temperature detector 13, and current detector 14.

Controller 15 can be configured with a microcomputer and a non-volatile memory (for example, electrically erasable programmable read-only memory (EEPROM), flash memory). SOC-OCV (Open Circuit Voltage) map 15a is held in the non-volatile memory. SOC-OCV map 15a describes characteristic data of SOC-OCV curves of the plurality of cells C1 to C20.

Controller 15 estimates SOCs and SOHs of the plurality of cells C1 to C20 based on the voltages, currents, and temperatures of the plurality of cells C1 to C20. The SOC can be estimated, for example, by an OCV method or a current integration method. The OCV method is a method for estimating SOC based on the OCV of the detected cell and the characteristic data of the SOC-OCV curve held in the non-volatile memory. The current integration method is a method for estimating SOC based on the OCV at the start of charging/discharging of the detected cell and the integrated value of the detected current.

The SOH is defined as the ratio of the current full charge capacity to the initial full charge capacity, and the lower the value (closer to 0%), the more the deterioration progresses. The deterioration of a secondary battery can be approximated by the sum of storage deterioration and cycle deterioration.

The storage deterioration is deterioration that progresses over time depending on the temperature of a secondary battery at each time point and the SOC at each time point, regardless of whether the secondary battery is being charged or discharged. The higher the SOC at each time point (closer to 100%) or the higher the temperature at each time point, the higher the storage deterioration rate becomes.

The cycle deterioration is deterioration that progresses with increase in a number of times charging and discharging are performed. The cycle degradation depends on the SOC range used, temperature, and current rate. The wider the SOC range used, the higher the temperature, or the higher the current rate, the higher the cycle deterioration rate becomes. In this way, the deterioration of a secondary battery largely depends on the usage environment, and as the usage period becomes longer, the capacity variation of the plurality of cells C1 to C20 becomes larger.

Controller 15 executes an equalization process between the plurality of cells C1 to C20 based on the voltages of the plurality of cells C1 to C20 received from voltage detector 12. In a general passive cell balance method, the other cells are discharged to the capacity of the cell having the smallest capacity (hereinafter referred to as a target value) among the plurality of cells C1 to C20. The target value may be defined by any of the actual capacity, SOC, and OCV. When defined by OCV, the OCV of the cell with the lowest OCV becomes the target value. The target value may be defined by the dischargeable quantity or the chargeable quantity.

Controller 15 sets the detected value of the cell having the smallest capacity among the plurality of cells C1 to C20 as the target value, and calculates the differences between the target value and the detected values of the plurality of other cells. Controller 15 calculates discharge quantities of the other plurality of cells based on the calculated differences. Controller 15 calculates discharge times of the other plurality of cells based on the calculated discharge quantities. Controller 15 generates a control signal for the equalization process including the discharge times of the plurality of cells C1 to C20 and transmits the control signal to voltage detector 12. A switch control circuit (not shown) in voltage detector 12 controls a plurality of discharge switches S1 to S20 in an ON state for specified times based on the control signal received from controller 15.

A minute short circuit may occur in any of the plurality of cells C1 to C20. Since a minute short circuit may cause an unsafe event such as overheating, it is necessary to detect it before it reaches an unsafe event.

FIGS. 2(a) and 2(b) are diagrams showing a comparison between a normal cell and a minute short-circuited cell. As shown in FIG. 2(a), normal cell Cn has terminal voltage determined by electromotive force E1 and internal resistance Ri. On the other hand, as shown in FIG. 2(b), minute short-circuited cell Cn has minute short circuit path Ps formed inside, and a current also flows through micro short circuit path Ps. Therefore, there occurs in minute short-circuited cell Cn self-discharge generated by internal resistance Ri and discharge generated by minute short circuit path Ps. Thus, a voltage drop of minute short-circuited cell Cn is larger than a voltage drop of normal cell Cn.

FIG. 3 is a flowchart showing a first reference example of a method for detecting a minute short circuit by management device 10 according to the exemplary embodiment of the present invention. Voltage detector 12 detects voltages of n cells connected in series and transmits the voltages to controller 15 (S10). After a predetermined determination period (for example, 10 minutes) has elapsed (Y in S11), out of the detected voltages of the n cells, controller 15 calculates an average voltage of (n−2) cells, excluding the maximum voltage and the minimum voltage (S12). Controller 15 calculates a voltage difference between the calculated average voltage and the detected voltage of one cell to be detected (hereinafter referred to as a target cell) (S13).

Controller 15 calculates difference voltage $\Delta V$ between the current voltage difference calculated this time and the voltage difference calculated $\Delta t$ hour(s) (for example, one hour) earlier (S14). Controller 15 compares calculated difference voltage $\lambda V$ with a determination threshold value (S15). The determination threshold value is determined based on a resistance value of assumed minute short circuit path Ps and $\Delta t$ hour(s). For example, when the resistance value of minute short circuit path Ps is assumed as 100Ω and $\Delta t$ hour(s) is set to one hour, a voltage drop of about 4 mV per hour will occur in the lithium ion battery cell having generated a minute short circuit. In this case, the determination threshold value is set to 4 mV.

When calculated difference voltage $\Delta V$ is greater than or equal to the determination threshold value (Y in S15), controller 15 determines that a minute short circuit has occurred in the target cell (S16). When calculated difference voltage $\Delta V$ is less than the determination threshold value (N in S15), controller 15 determines that no minute short circuit has occurred in the target cell. The above process is repeatedly executed for all the cells included in power storage module M1 while power supply system 1 is in operation (N in S17).

Figure 4:
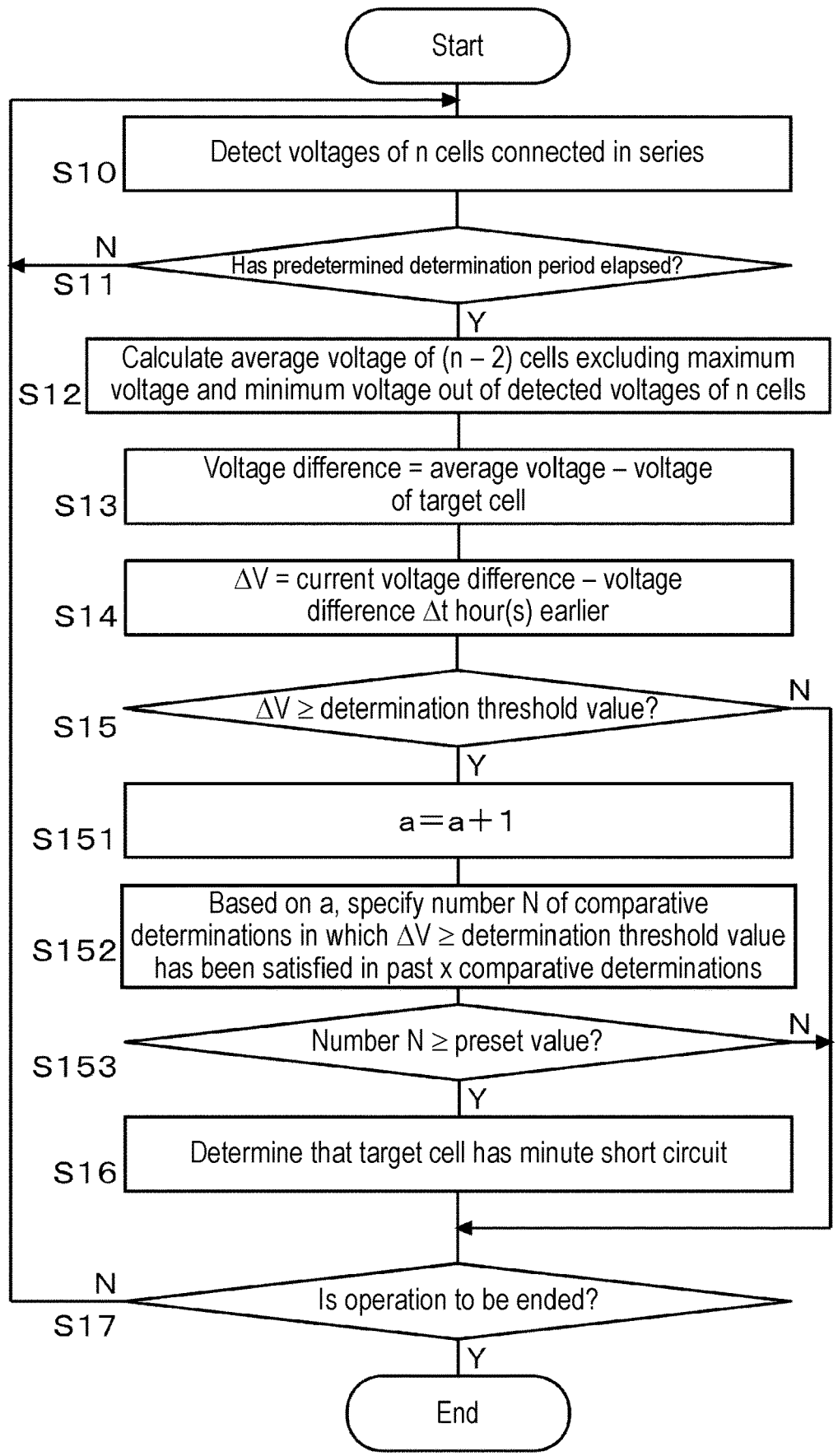
FIG. 4 is a flowchart showing a second reference example of a method for detecting a minute short circuit by the management device according to the exemplary embodiment of the present invention.

FIG. 4 is a flowchart showing a second reference example of a method for detecting a minute short circuit by management device 10 according to the exemplary embodiment of the present invention. Since the processing up to step S15 is the same as that of the first reference example shown in FIG. 3, description thereof will be omitted. When difference voltage $\Delta V$ calculated in step S15 is greater than or equal to the determination threshold value (Y in S15), controller 15 increments variable a (S151). An initial value of variable a is 0. Based on the value of variable a, controller 15 specifies a number of times N that difference voltage $\Delta V$ became greater than or equal to the determination threshold value in the past x (for example, 40) comparative determinations (S152).

When the number of times N is greater than or equal to a set value (for example, 30) (Y in S153), controller 15 determines that a minute short circuit has occurred in the target cell (516). When the number of times N is less than the set value (N in S153), controller 15 determines that no minute short circuit has occurred in the target cell. By adjusting the value of x and the set value, the balance between the time required for detecting a minute short circuit and the determination accuracy can be adjusted. The relationship between the two is a trade-off relationship, and the larger the value of x, the longer the detection time becomes, but the higher the determination accuracy becomes. The first example shown in FIG. 3 is the example in which the detection time is the shortest.

The above process is repeatedly executed for all the cells included in power storage module M1 while power supply system 1 is in operation (N in 517). In the processes shown in FIGS. 3 and 4, the target cell may also be included in the basic data for calculating the average voltage. The maximum voltage and the minimum voltage are excluded by one each from the detected voltages of the n cells, but a number of exclusions may be two or zero. That is, the average voltage may be calculated from all the detected voltages of the n cells. Instead of calculating the average value of the plurality of detected voltages, a median value of the plurality of detected voltages may be calculated.

The method for detecting a minute short circuit described above has a problem that it is difficult to distinguish between a voltage drop due to equalization discharge and a voltage drop due to a minute short circuit during the equalization process. To handle this, a method capable of detecting a minute short circuit with high accuracy even during the equalization process will be described below.

FIGS. 5(a) and 5(b) are diagrams showing a first example in which the equalization process and the minute short circuit detection process compete with each other. In FIGS. 5(a) and 5(b), for simplification of explanation, there is assumed a power storage module in which a normal first cell and two second cells with a minute short circuit are connected in series. The normal first cell may be considered as a cell in which a plurality of cells that are the basis for calculating the average voltage are integrated.

FIG. 5(a) shows transition of voltages of a first cell and a second cell and transition of voltage difference between the first cell and the second cell according to a comparative example. The first cell is a normal cell, and the second cell is a cell in which a minute short circuit has occurred. The voltage of the first cell is higher than that of the second cell. Since the second cell has a minute short circuit, the voltage drops with the passage of time. In the normal first cell, the voltage drops only during the equalization process, and the voltage does not change during the normal period. Due to the voltage drop in the second cell, the voltage difference between the first cell and the second cell increases, but the voltage difference decreases during the equalization process of the first cell. The decrease in the voltage difference during the equalization process becomes an obstacle to the process of detecting the presence or absence of a minute short circuit based on whether the voltage difference varies at a predetermined inclination.

The voltage of a cell with a minute short circuit is usually lower than that of the other cells connected in series. In the case of the passive type equalization process shown in the present exemplary embodiment, basically such a cell is not subjected to equalization discharge. Even if such a cell is subjected to equalization discharge, the discharge time of the cell will be shorter than that of other cells.

FIG. 5(b) shows transition of voltages of a first cell and a second cell and transition of voltage difference between the first cell and the second cell according to an example. The discharge time due to the equalization process of the normal first cell is known, and the quantity of transfer energy from the first cell due to the equalization process can be calculated. Controller 15 cancels the influence of change (decrease) in cell voltage due to the equalization process by adding the voltage compensation value corresponding to the quantity of transfer energy due to the equalization process to the detected voltage of the first cell. As a result, the presence or absence of a minute short circuit can be determined with high accuracy even during the equalization process.

FIGS. 6(a) and 6(b) are diagrams showing a second example in which the equalization process and the minute short circuit detection process compete with each other. FIG. 6(a) shows transition of voltages of a first cell and a second cell and transition of voltage difference between the first cell and the second cell according to a comparative example. Both the first cell and the second cell are normal cells, and the voltage of the first cell is higher than that of the second cell. The first cell is the cell to be determined. When the equalization process is started, the first cell having a high voltage is discharged for equalization so that the voltage of the first cell decreases. The voltage of the second cell, which is not to be subjected to equalization discharge, does not change. During the equalization process, a predetermined inclination occurs in the voltage difference between the first cell and the second cell. Thus, even if the first cell has no minute short circuit, it may be erroneously detected that the first cell has a minute short circuit.

FIG. 6(b) shows transition of voltages of a first cell and a second cell and transition of voltage difference between the first cell and the second cell according to an example. The discharge time due to the equalization process of the normal first cell is known, and the quantity of transfer energy emitted from the first cell by the equalization process can be calculated. Controller 15 cancels the influence of voltage change (voltage decrease) due to the equalization process by providing (adding) the voltage compensation value corresponding to the quantity of transfer energy due to the equalization process to the detected voltage of the first cell. As a result, the presence or absence of a minute short circuit can be determined with high accuracy even during the equalization process.

The first example shown in FIGS. 5(a) and 5(b) is an example of a detection failure (false negative) in which a generated minute short circuit is not detected, and the second example shown in FIGS. 6(a) and 6(b) is an example of erroneous detection (false positive) in which a normal cell is determined to be a cell with a minute short circuit. Hereinafter, the correction methods shown in FIGS. 5(b) and 6(b) will be described in detail.

Figure 7:
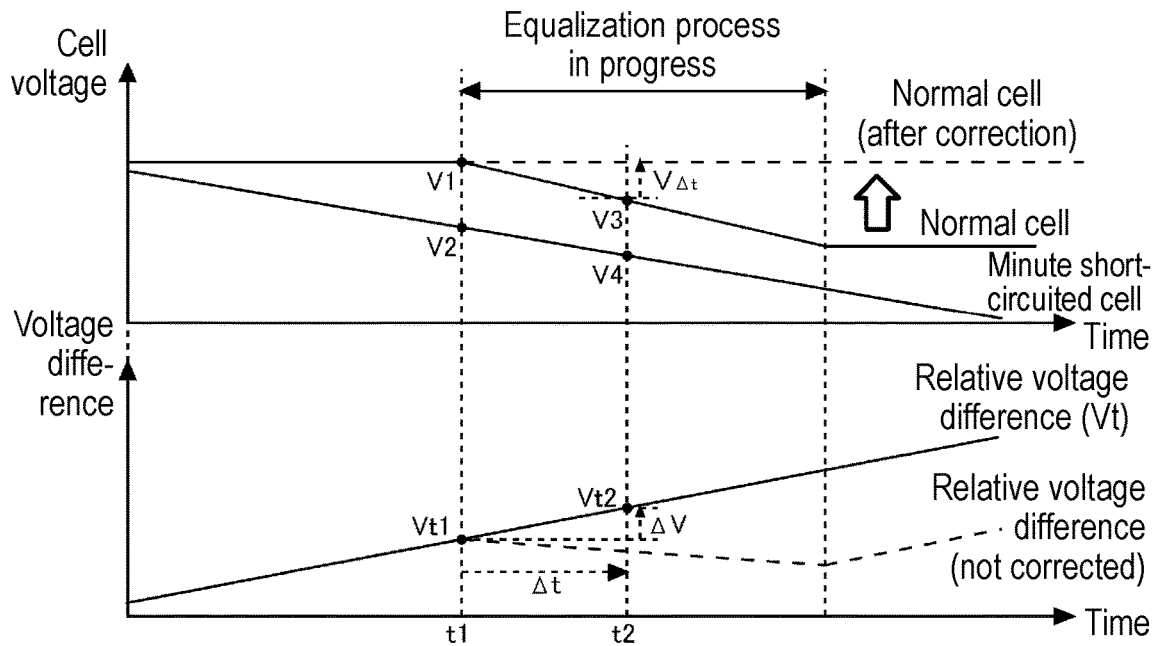
FIG. 7 is a diagram showing FIG. 5(b) in detail.
Figure 8:
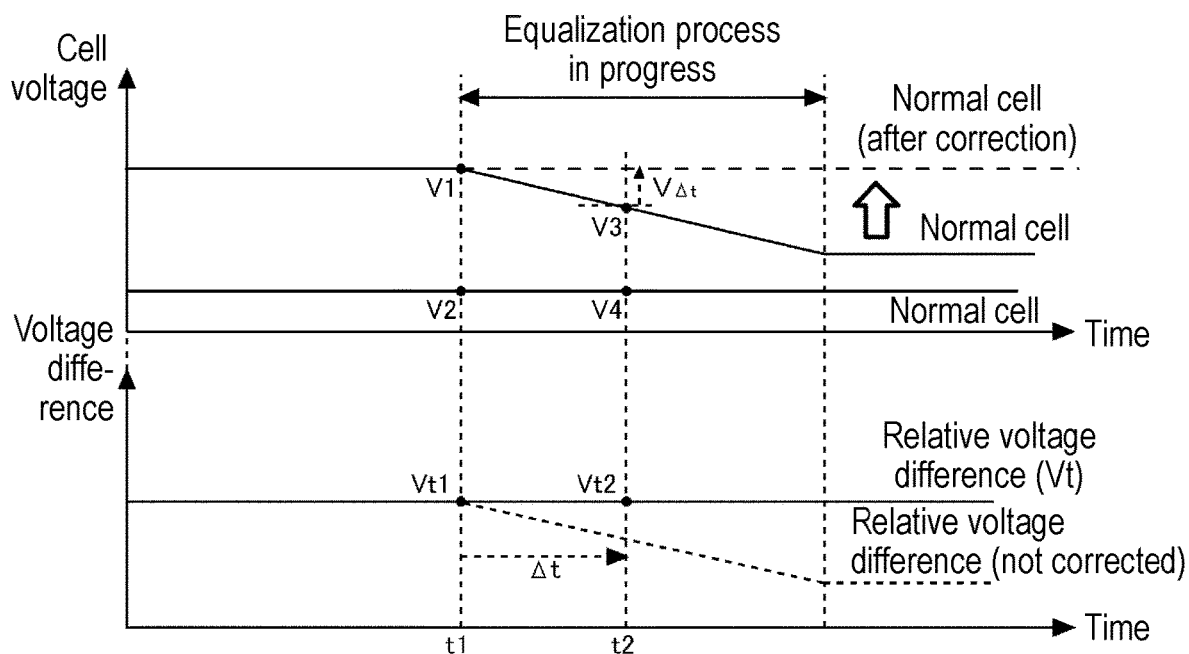
FIG. 8 is a diagram showing FIG. 6(b) in detail.

FIG. 7 is a diagram showing FIG. 5(b) in detail. FIG. 8 is a diagram showing FIG. 6(b) in detail. As a premise, the value of a discharge resistance connected in parallel with the first cell is denoted as R. At first time t1, a detected voltage of the normal first cell is denoted as V1, a detected voltage of the second cell with a minute short circuit is denoted as V2, and an equalizing current flowing from the first cell to the discharge resistance is denoted as I1 (=V1/R). At second time t2, which is Δt hours after first time 0, a detected voltage of the normal first cell is denoted as V3, a detected voltage of the second cell with a minute short circuit is denoted as V4, and an equalizing current flowing from the first cell to the discharge resistance is denoted as 13 (=V3/R). Note that V1 to V4 are detected values, R is a known circuit constant, and Δt is a known determination period.

Relative voltage difference Vt1 between the first cell and the second cell at first time t1 is expressed by following equation (1). Relative voltage difference Vt2 between the first cell and the second cell at second time t2 is expressed by following equation (2).

$$Vt1=(V1-V2) \quad \text{Equation (1)}$$

$$Vt2=((V3+V_{\Delta t})-V4) \quad \text{Equation (2)}$$

Compensation value $V_{\Delta t}$ can be estimated based on the SOC-OCV curve, detected voltage V3 of the first cell at second time t2, and transfer energy quantity Qt due to the equalization process. Transfer energy quantity Qt due to the equalization process can be calculated by following equation (3).

$$Qt=((I1+13)/2)\times\Delta t=(((V1+V3)/R)/2)\times\Delta t \quad \text{Equation (3)}$$

Figure 9:
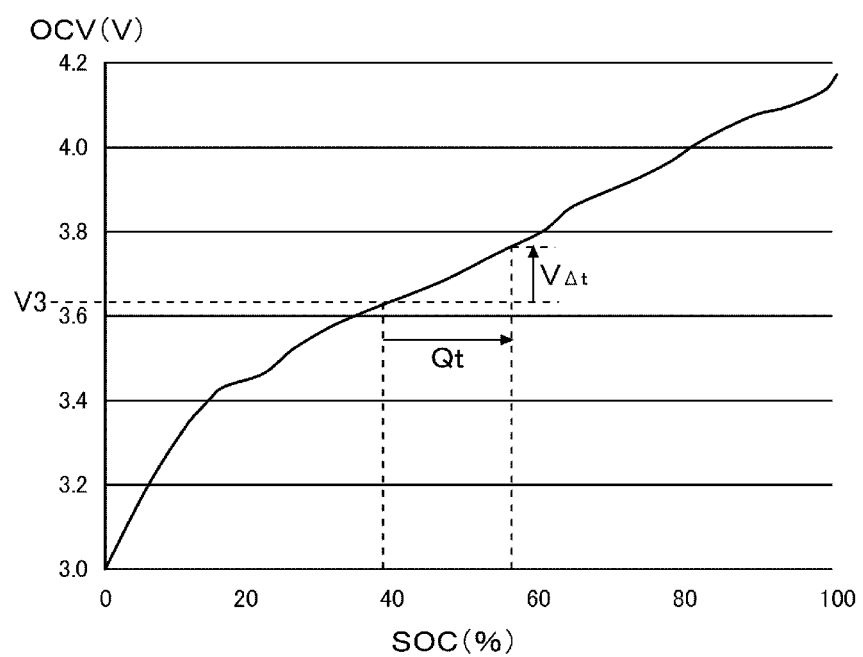
FIG. 9 is a diagram for explaining a process of obtaining compensation value WI from a SOC-OCV curve, detected voltage V3 of a first cell, and transfer energy quantity Qt.

FIG. 9 is a diagram for explaining a process of obtaining compensation value $V_{\Delta t}$ from a SOC-OCV curve, detected voltage V3 of the first cell, and transfer energy quantity Qt. Controller 15 estimates the SOC of the first cell before the equalization process by providing (adding) transfer energy quantity Qt due to the equalization process to the SOC corresponding to detected voltage V3 of the first cell. Controller 15 specifies the voltage of the first cell corresponding to the SOC, and calculates the difference between the specified voltage and detected voltage V3 of the first cell as compensation value $V_{\Delta t}$.

As shown in following equation (4), controller 15 determines the presence or absence of a minute short circuit by comparing difference voltage ΔV of the relative voltage difference before and after the lapse of Δt hour(s) with determination threshold value E.

$$\Delta V=Vt2-Vt1=((V3+V_{\Delta t})-V4)-(V1-V2)\geq E \quad \text{Equation (4)}$$

In the example shown in FIG. 7, difference voltage ΔV of the relative voltage difference before and after the lapse of Δt hour(s) exceeds determination threshold value E, and it is determined that a minute short circuit has occurred in the second cell. The transition of relative voltage difference V without addition of compensation value $V_{\Delta t}$ is as shown by the dotted line. In that case, difference voltage ΔV does not exceed determination threshold value E, and it is determined that no minute short circuit has occurred in the second cell. That is, there occurs a detection failure.

In the example shown in FIG. 8, difference voltage ΔV of the relative voltage difference before and after the lapse of Δt hour(s) does not exceed determination threshold value E, and it is determined that no minute short circuit has occurred in the first cell. In the example shown in FIG. 8, difference voltage ΔV is approximately zero. The transition of relative voltage difference V without addition of compensation value $V_{\Delta t}$ is as shown by the dotted line. In that case, difference voltage ΔV exceeds determination threshold value E, and it is determined that a minute short circuit has occurred in the first cell. That is, there occurs erroneous detection.

Figure 10:
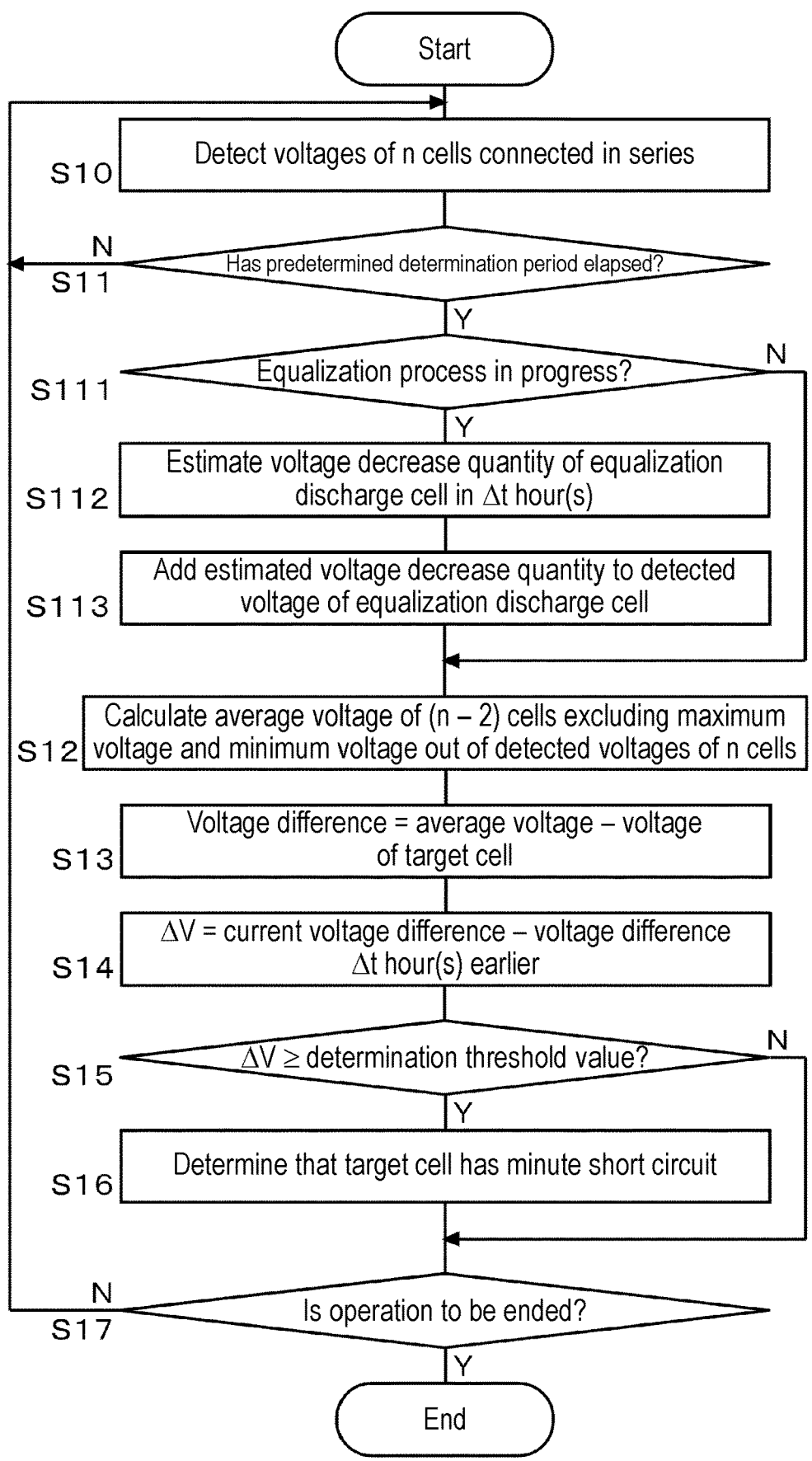
FIG. 10 is a flowchart showing a first example of a method for detecting a minute short circuit by the management device according to the exemplary embodiment of the present invention.

FIG. 10 is a flowchart showing a first example of a method for detecting a minute short circuit by management device 10 according to the exemplary embodiment of the present invention. Voltage detector 12 detects voltages of n cells connected in series and transmits the voltages to controller 15 (S10). When a predetermined determination period (for example, 10 minutes) has elapsed (Y in S11), controller 15 determines whether power storage module M1 including the n cells connected in series is undergoing equalization process (S111).

When the equalization process is in progress (Y in S111), controller 15 estimates a voltage decrease quantity of the equalized discharge cell in Δt hour(s) (for example, one hour) (S112). Controller 15 adds the estimated voltage decrease quantity as compensation value $V_{\Delta t}$ to the detected voltage of the equalized discharge cell (S113). In step S111, when the equalization process is not in progress (N in S111), controller 15 skips steps S112 and S113.

Out of the detected voltages of the n cells, controller 15 calculates an average voltage of (n−2) cells, excluding the maximum voltage and the minimum voltage (S12). Controller 15 calculates a voltage difference between the calculated average voltage and the detected voltage of the target cell (S13).

Controller 15 calculates difference voltage ΔV between the current voltage difference calculated this time and the voltage difference calculated Δt hour(s) earlier (S14). Controller 15 compares calculated difference voltage ΔV with a determination threshold value (S15). When calculated difference voltage ΔV is greater than or equal to the determination threshold value (Y in S15), controller 15 determines that a minute short circuit has occurred in the target cell (S16). When calculated difference voltage ΔV is less than the determination threshold value (N in S15), controller 15 determines that no minute short circuit has occurred in the target cell. The above process is repeatedly executed for all the cells included in power storage module M1 while power supply system 1 is in operation (N in S17).

Controller 15 calculates difference voltage ΔV between the current voltage difference calculated this time and the voltage difference calculated Δt hour(s) (for example, one hour) earlier (S14). Controller 15 compares calculated difference voltage ΔV with a determination threshold value (S15). The determination threshold value is set to a value corresponding to the value of a gradient of a linear function. When the gradient of the linear function is set to be steep, the value of difference voltage ΔV is calculated to be large, so it is necessary to set the determination threshold value to be large.

When calculated difference voltage ΔV is greater than or equal to the determination threshold value (Y in S15), controller 15 determines that a minute short circuit has occurred in the target cell (S16). When calculated difference voltage ΔV is less than the determination threshold value (N in S15), controller 15 determines that no minute short circuit has occurred in the target cell. The above process is repeatedly executed for all the cells included in power storage module M1 while power supply system 1 is in operation (N in S17).

Figure 11:
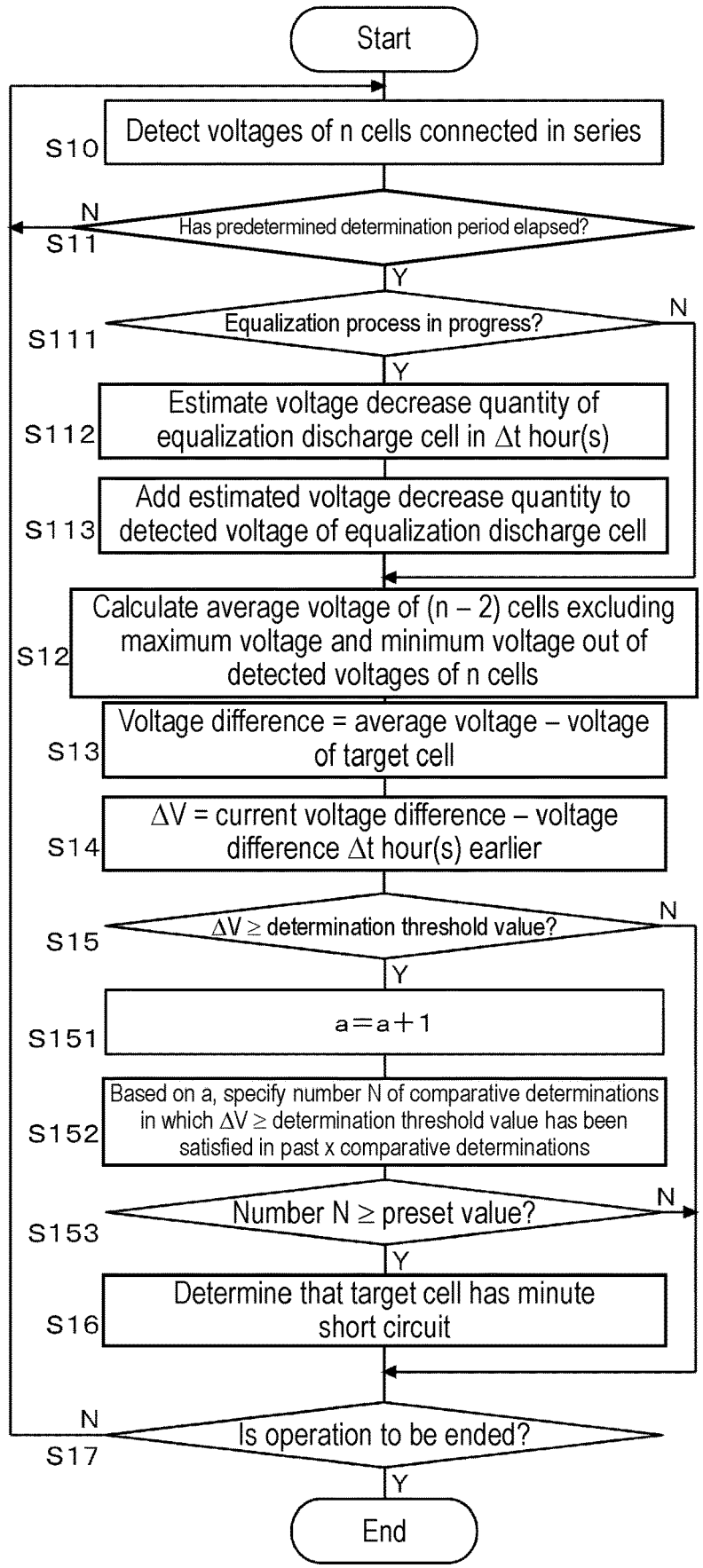
FIG. 11 is a flowchart showing a second example of a method for detecting a minute short circuit by the management device according to the exemplary embodiment of the present invention.

FIG. 11 is a flowchart showing a second example of a method for detecting a minute short circuit by management device 10 according to the exemplary embodiment of the present invention. Since the processing up to step S15 is the same as that of the first example shown in FIG. 10, description thereof will be omitted. When difference voltage ΔV calculated in step S15 is greater than or equal to the determination threshold value (Y in S15), controller increments variable a (S151). An initial value of variable a is 0. Based on the value of variable a, controller 15 specifies a number of times N that difference voltage ΔV became greater than or equal to the determination threshold value in the past x (for example, 40) comparative determinations (S152).

When the number of times N is greater than or equal to a set value (for example, 30) (Y in S153), controller 15 determines that a minute short circuit has occurred in the target cell (S16). When the number of times N is less than the set value (N in S153), controller 15 determines that no minute short circuit has occurred in the target cell. The above process is repeatedly executed for all the cells included in power storage module M1 while power supply system 1 is in operation (N in S17).

According to the method for detecting a minute short circuit described above, it is possible to detect a minute short circuit with high accuracy when the SOCs and SOHs of the plurality of cells C1 to C20 are even. However, when the SOCs or SOHs of the plurality of cells C1 to C20 are varying, the fluctuation of voltage difference between the average voltage and the target cell voltage cannot be detected uniformly, which lowers the detection accuracy of a minute short circuit. Thus, a method for uniformly evaluating the voltage difference by mapping the cell detected voltages according to the SOC and SOH on a linear line defined for uniformly evaluating the fluctuation of the voltage difference will be described below.

Figure 12:
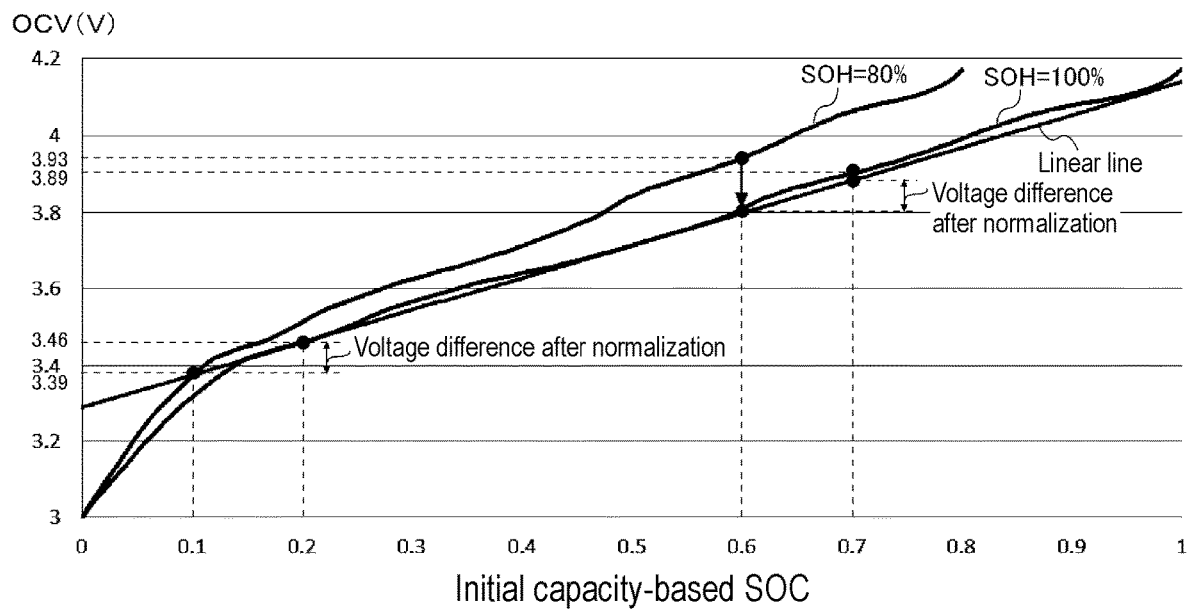
FIG. 12 is a diagram showing an example of an SOC-OCV curve with SOH=80% and a SOC-OCV curve with SOH=100%.

FIG. 12 is a diagram showing an example of an SOC-OCV curve with SOH=80% and a SOC-OCV curve with SOH=100%. The horizontal axis of FIG. 12 indicates the SOC based on the initial capacity, and the vertical axis indicates the OCV. The SOC based on the initial capacity is defined as current SOC/initial FCC (full charge capacity). That is, the SOC based on the initial capacity is the SOC obtained by normalizing the current SOC with the initial full charge capacity.

SOC-OCV map 15a may have a plurality of SOC-OCV curves of the cells used for power storage module M1 registered in advance, in SOH 1% increments, SOH 5% increments, or SOH 10% increments. If only a SOC-OCV curve with SOH=100% is registered in SOC-OCV map 15a, controller 15 corrects the SOC-OCV curve with SOH=100% based on the SOHs of the cells to derive approximate SOC-OCV curves for the cells. Specifically, by reducing the SOC-OCV curve with SOH=100% in an X-axis direction according to the SOHs of the cells, controller 15 can derive approximate curves of the SOC-OCV curve according to the SOHs of the cells.

As shown in FIG. 12, it is assumed that there are a first cell with SOH=80% and an initial capacity-based SOC of 0.1 and a second cell with SOH=100% and an initial capacity-based SOC of 0.2. At this time, the OCV of the first cell is 3.39V, and the OCV of the second cell is 3.46V. When the first and second cells connected in series are charged in correspondence with SOC=0.5 based on the initial capacity, the initial capacity-based SOC of the first cell increases to 0.6, and the initial capacity-based SOC of the second cell increases to 0.7. At this time, the OCV of the first cell rises to 3.93V, and the OCV of the second cell rises to 3.89V.

Before charging, the OCV of the second cell was higher than the OCV of the first cell, but after charging, the OCV of the first cell is higher than the OCV of the second cell. That is, the signs of the voltage differences between the two are reversed. This is due to the SOH difference between the first cell and the second cell. Therefore, the SOH difference is normalized.

A linear function (linear line) with initial capacity-based SOC as an input variable, OCV as an output variable, and a gradient as positive is introduced. In the example shown in FIG. 12, a tangent line passing through a point of 0.5 where the initial capacity-based SOC of a SOC-OCV curve with SOH=100% is introduced as a linear line.

Controller 15 refers to a SOC-OCV curve corresponding to the SOH of each cell, and estimates the initial capacity-based SOC corresponding to the detected voltage of each cell. If power storage module M1 is under charging or discharging when the cell voltage is detected, the detected voltage is a closed circuit voltage (CCV) instead of OCV. As a simple method, there is a method by which the CCV is passed through a noise reduction filter and the CCV after noise removal is treated as OCV. As a stricter method, there is a method by which the CCV is corrected based on the current and internal resistance to estimate the OCV. At that time, the accuracy can be further improved by correcting the internal resistance according to the temperature, SOC, and SOH.

Controller 15 applies the initial capacity-based SOC corresponding to the detected voltage of each cell to the above linear function to derive alternative OCV. Controller 15 calculates the voltage difference after normalization based on the alternative OCV. In FIG. 12, the OCV with an initial capacity-based SOC of 0.6 in the SOC-OCV curve with SOH=80% is moved downward and converted to the OCV with an initial capacity-based SOC of 0.6 in the linear line. In addition, the OCV with an initial capacity-based SOC of 0.7 in the SOC-OCV curve with SOH=100% is moved downward and converted to the OCV with an initial capacity-based SOC of 0.7 in the linear line. Then, the voltage difference between the two OCVs converted on the linear line is calculated as the voltage difference after normalization.

In the example shown in FIG. 12, since it can be evaluated that there is no difference between the post-normalization voltage difference before charging and the post-normalization voltage difference after charging, it is determined that no minute short circuit has occurred. On the other hand, when SOH is not normalized, there is a difference between the voltage difference before charging and the voltage difference after charging, so it is erroneously determined that a minute short circuit has occurred even though no minute short circuit has actually occurred.

The same applies to the case of comparing the voltage difference before discharging and the voltage difference after discharging. In this way, mapping the voltage difference before charging/discharging and the voltage difference after charging/discharging on a straight line can absorb the difference in the SOC-OCV curve due to the difference in SOH between the first cell and the second cell. That is, changes in SOC among a plurality of cells connected in series due to charging/discharging of the plurality of cells can be replaced with linear changes in which the SOC ratio among the plurality of cells is maintained. If no minute short circuit has occurred, the voltage differences among the plurality of cells will be constant at any section of the straight line.

Figure 13:
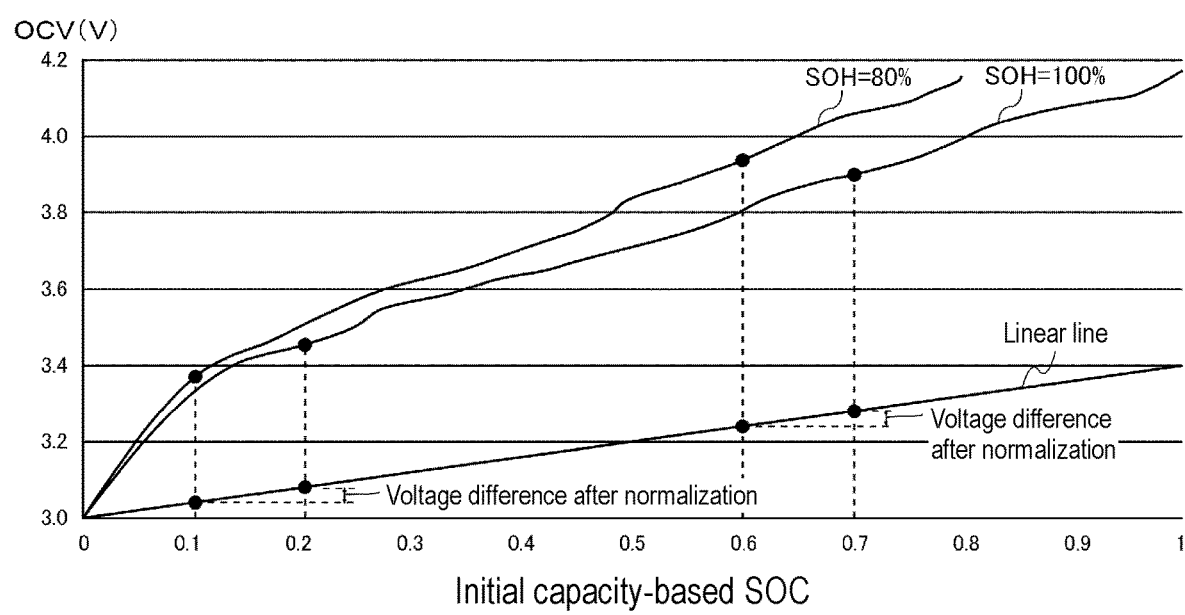
FIG. 13 is a diagram in which the position of a linear line in FIG. 12 is changed.

FIG. 13 is a diagram in which the position of the linear line in FIG. 12 is changed. The linear line may be introduced at any position as long as it has a gradient of a value larger than the minimum unit of detection by voltage detector 12. If the gradient is smaller than the minimum unit of detection by voltage detector 12, it is not possible to detect the changes in the voltage difference among the plurality of cells with high accuracy.

Figure 14:
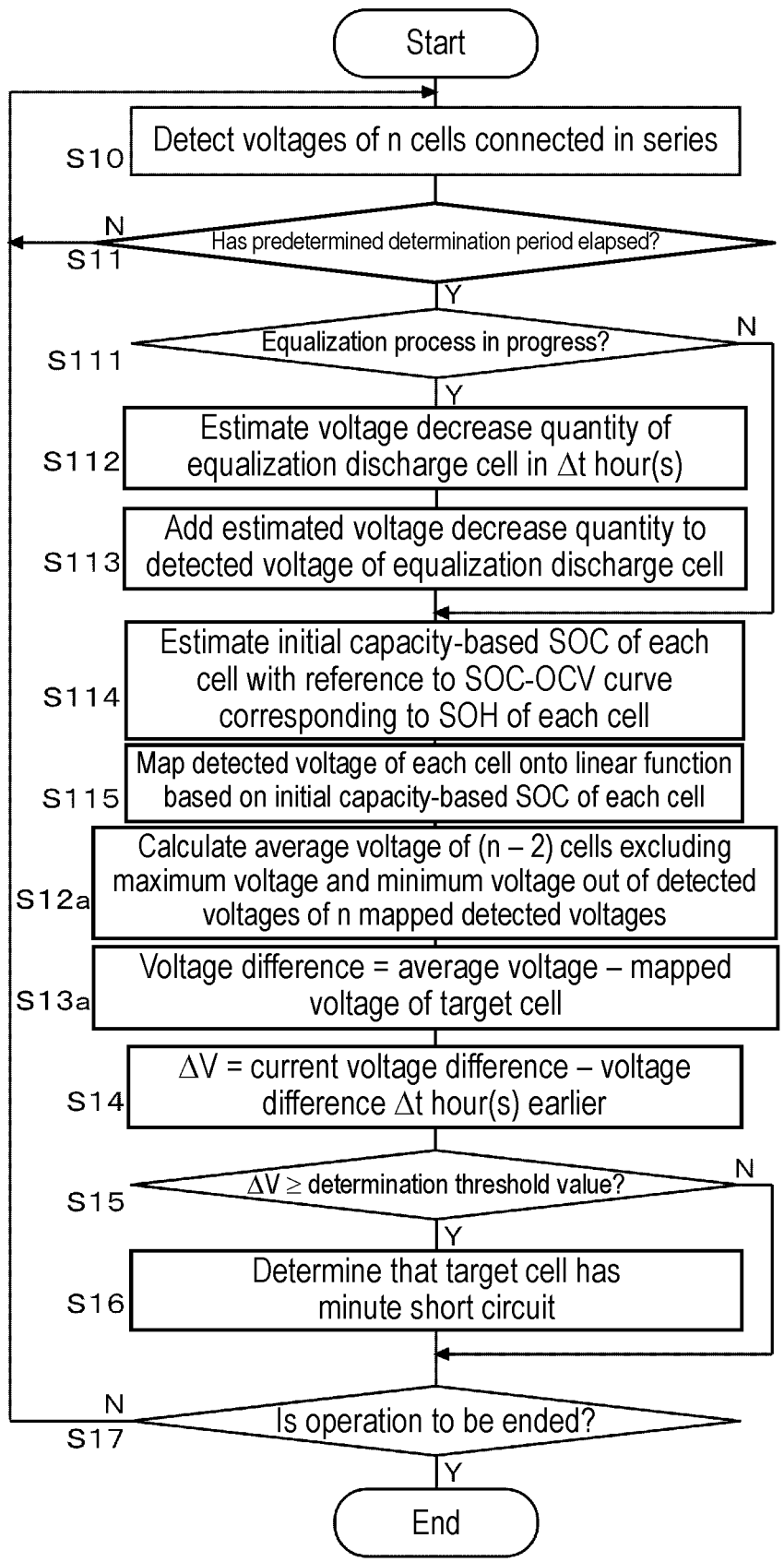
FIG. 14 is a flowchart showing a third example of a method for detecting a minute short circuit by the management device according to the exemplary embodiment of the present invention.

FIG. 14 is a flowchart showing a third example of a method for detecting a minute short circuit by management device 10 according to the exemplary embodiment of the present invention. Voltage detector 12 detects voltages of n cells connected in series and transmits the voltages to controller 15 (S10). When a predetermined determination period (for example, 10 minutes) has elapsed (Y in S11), controller 15 determines whether power storage module M1 including the n cells connected in series is undergoing equalization process (S111).

When the equalization process is in progress (Y in S111), controller 15 estimates a voltage decrease quantity of the equalized discharge cell in Δt hour(s) (for example, one hour) (S112). Controller 15 adds the estimated voltage decrease quantity as compensation value $V_{\Delta t}$ to the detected voltage of the equalized discharge cell (S113). In step S111, when the equalization process is not in progress (N in S111), controller 15 skips steps S112 and S113.

Controller 15 refers to a SOC-OCV curve corresponding to the SOH of each cell, and estimates the initial capacity-based SOC of each cell (S114). Controller 15 maps the detected voltage of each cell to a linear function based on the initial capacity-based SOC of each cell (S115). Out of the n mapped detected voltages, controller 15 calculates an average voltage of (n−2) cells, excluding the maximum voltage and the minimum voltage (S12a). Controller calculates a voltage difference between the calculated average voltage and the mapped voltage of the target cell (S13a).

Controller 15 calculates difference voltage ΔV between the current voltage difference calculated this time and the voltage difference calculated Δt hour(s) earlier (S14). Controller 15 compares calculated difference voltage ΔV with a determination threshold value (S15). The determination threshold value is set to a value corresponding to the value of a gradient of a linear function. When the gradient of the linear function is set to be steep, the value of difference voltage ΔV is calculated to be large, so it is necessary to set the determination threshold value to be large.

When calculated difference voltage ΔV is greater than or equal to the determination threshold value (Y in S15), controller 15 determines that a minute short circuit has occurred in the target cell (S16). When calculated difference voltage ΔV is less than the determination threshold value (N in S15), controller 15 determines that no minute short circuit has occurred in the target cell. The above process is repeatedly executed for all the cells included in power storage module M1 while power supply system 1 is in operation (N in S17).

A fourth example of a method for detecting a minute short circuit by management device 10 according to the exemplary embodiment of the present invention has steps S151, S152, and S153 shown in FIG. 4 or 11 added between step S15 and step S16 in the flowchart of FIG. 14.

As described above, in the present exemplary embodiment, the presence or absence of a minute short circuit is determined based on the gradient of the voltage difference among the plurality of cells (the quantity of expansion of voltage difference per unit time). At that time, the equalization-discharged capacity is calculated based on the cell equalization discharge time, and the detected voltages of the cells having undergone the equalization discharging are corrected based on the capacity. This makes it possible to perform the detection process of minute short circuits at all times regardless of the presence or absence of the equalization process. The presence or absence of a minute short circuit can be determined at any time. Therefore, it is possible to prevent the lengthening of a time from the occurrence to detection of a minute short circuit caused by the interruption of the detection process of a minute short circuit due to the competition with the equalization process. That is, it is possible to suppress the occurrence of an unsafe event due to a delay in detecting a minute short circuit. Further, it is not necessary to change the process of determining the presence or absence of a minute short circuit depending on whether the equalization process is in progress, thereby to simplify the determination process.

Further, by converting the detected voltage of each cell into a value on a straight line, the presence or absence of a minute short circuit can be evaluated by a common index regardless of the state of SOC or SOH. More specifically, a linear line that monotonically increases with the initial capacity-based SOC on the horizontal axis is introduced, and the detected voltages of the cells are converted into values on the linear line according to the SOCs and SOHs to calculate the voltage differences among the plurality of cells. The voltage differences normalized in this way do not change in the absence of a minute short circuit. When a minute short circuit occurs, the normalized voltage differences expand uniformly regardless of SOCs or SOHs. The presence or absence of a minute short circuit can be uniformly determined without changing the determination threshold value according to SOC or SOH.

In this way, the detected voltages are uniformly converted into values capable of determining the presence or absence of a minute short circuit from the limited information of the SOCs, SOHs, and the detected voltages of the cells without changing the determination threshold value and the determination conditions. As a result, the presence or absence of a minute short circuit can be evenly and accurately determined in any phase during long-term operation without subdividing the determination conditions.

The present invention has been described so far according to the exemplary embodiment of the present invention. It will be understood by those skilled in the art that the exemplary embodiment is merely an example, other exemplary modifications in which components and processes of the exemplary embodiment are variously combined are possible, and the other exemplary modifications also fall within the scope of the present invention.

FIGS. 12 and 13 show examples of using a linear function with a positive gradient, but a linear function with a negative gradient may be used instead. In that case, the relationship in magnitude between the difference voltage and the determination threshold value may be reversed for determination.

In the above-described exemplary embodiment, the present invention is applied to the passive equalization process as an example. However, the present invention can also be applied to the active equalization process. The active equalization process is a method by which energy is transferred from a cell having a large capacity to a cell having a small capacity to make even the capacities among a plurality of cells. The active equalization process circuit includes, for example, a capacitor, an inductor, or a transformer which is a passive element capable of storing electricity, and a multiplexer which selectively connects a predetermined cell from a plurality of cells connected in series to the passive element.

In the active equalization process, a voltage compensation value corresponding to the quantity of energy to be transferred is provided by subtraction to the detected voltage of a discharge side cell that is the energy transfer source, and the voltage compensation value corresponding to the quantity of energy to be transferred is provided by addition to the detected voltage of a charge side cell that is the energy transfer destination, thereby to cancel out the influence of the change in the cell voltages due to the equalization process. As a result, the presence or absence of a minute short circuit can be determined with high accuracy even during the equalization process.

In the above-described exemplary embodiment, the present invention is applied to power supply system 1 for in-vehicle use as an example. However, the present invention can also be applied to power supply systems for stationary power storage. The present invention can also be applied to power supply systems for electronic devices such as notebook personal computers (PCs) and smartphones.

The exemplary embodiment may be specified by the following items.

[Item 1]

Management device (10) including: voltage detector (12) that detects respective voltages of a plurality of cells (C1 to C20) connected in series; and controller (15) that executes (1) an equalization process of equalizing capacities of the plurality of cells (C1 to C20) based on detected voltages of the plurality of cells (C1 to C20) and (2) a cell abnormality determination process of, of the detected voltages of the plurality of cells (C1 to C20), calculating a voltage difference between a representative voltage based on the detected voltage of at least one cell to be compared and the detected voltage of one cell to be detected at a first time and a second time, and when the difference between the two voltage differences is greater than or equal to a threshold value, determining the cell to be detected as abnormal, wherein in the case of executing the cell abnormality determination process during the equalization process, controller (15) provides the detected voltage of a target cell to be subjected to the equalization process with a compensation value corresponding to a voltage change based on energy transfer in the target cell due to the equalization process between the first time and the second time, and calculates the voltage difference at the second time.

According to this, abnormality in cells (Cn) can be determined with high accuracy using a common determination standard regardless of whether the equalization process is in progress.

[Item 2]

Management device (10) according to claim 1, including a plurality of discharge circuits (R1 to R20, S1 to S20) connected in parallel to the plurality of cells (C1 to C20), wherein controller (15) controls the plurality of discharge circuits (R1 to R20, S1 to S20) to execute the equalization process, and calculates the compensation value corresponding to a voltage change in the detected voltage of the target cell to be subjected to the equalization process, based on quantity of energy consumed by a discharge circuit corresponding to the target cell out of the plurality of discharge circuits (R1 to R20, S1 to S20).

According to this, the compensation value corresponding to the voltage change due to the passive equalization process can be easily estimated.

[Item 3]

Management device (10) according to item 1, wherein controller (15) estimates the compensation value based on voltage of cell (Cn) at the first time, a circuit constant of discharge circuit (Rn, Sn) connected in parallel to cell (Cn), discharge time, and a state of charge (SOC)-open circuit voltage (OCV) curve of cell (Cn).

According to this, the compensation value corresponding to the voltage change due to the equalization process can be estimated with high accuracy.

[Item 4]

Management device (10) according to item 1 or 2, wherein controller (15) averages the detected voltages of the plurality of remaining cells excluding a maximum voltage and a minimum voltage out of the detected voltages of the plurality of cells (C1 to C20) to calculate the representative voltage.

According to this, it is possible to generate a high-quality voltage to be compared.

[Item 5]

Management device (10) according to any one of items 1 to 3, wherein controller (15) calculates the difference between the two voltage differences at each lapse of a predetermined time, compares the calculated difference between the voltage differences with the threshold value, and when the difference is greater than or equal to the threshold value at N (N is an integer of 2 or greater) times or more in past x (x is an integer of 2 or greater) comparisons, determines that the cell to be detected is abnormal.

According to this, the balance between the time required for detecting a minute short circuit and the determination accuracy can be adjusted.

[Item 6]

Power supply system (1) including: a plurality of cells (C1 to C20) connected in series; and management device (10) that manages the plurality of cells (C1 to C20) connected in series according to any one of items 1 to 4.

According to this, it is possible to construct power supply system (1) that is capable of determining abnormality in cells (Cn) with high accuracy using a common determination standard regardless of whether the equalization process is in progress.

REFERENCE MARKS IN THE DRAWINGS

1: power supply system
M1: power storage module
C1-C20: cell
Rs: shunt resistance
E1: electromotive force
Ri: internal resistance
R1-R20: discharge resistance
S1-S20: discharge switch
Ps: minute short circuit path
10 management device
11: discharge unit
12: voltage detector
13: temperature detector
14: current detector
15 controller
15*a*: SOC-OCV map

The invention claimed is:

1. A management device comprising:
a voltage detector that detects a voltage, the voltage being each of voltages detected from a plurality of cells connected in series; and
a controller that executes (1) an equalization process of equalizing capacities of the plurality of cells based on the voltages detected from the plurality of cells and (2) a cell abnormality determination process of, of the voltages detected from the plurality of cells, calculating, as a first voltage difference, each of voltage differences between a representative voltage based on the voltage of at least one cell to be compared and the voltage of one cell to be detected at a first time and calculating, as a second voltage difference, each of voltage differences between the representative voltage based on the voltage of the at least one cell to be compared and the voltage of one cell to be detected at a second time, and when a difference between the first voltage difference and the second voltage difference is greater than or equal to a threshold value, determining that the one cell to be detected is abnormal, wherein in a case of executing the cell abnormality determination process during the equalization process, the controller adds a compensation value corresponding to a voltage change based on energy transfer in the target cell due to the equalization process between the first time and the second time to the voltage of a target cell to be subjected to the equalization process, and calculates the second voltage difference at the second time.

2. The management device according to claim 1, further comprising a plurality of discharge circuits connected in parallel to the plurality of cells, wherein the controller controls the plurality of discharge circuits to execute the equalization process, and calculates the compensation value corresponding to a voltage change in the voltage of the target cell to be subjected to the equalization process, based on quantity of energy consumed by a discharge circuit corresponding to the target cell out of the plurality of discharge circuits.

3. The management device according to claim 1, wherein the controller estimates the compensation value based on a voltage of the cell at the first time, a circuit constant of the discharge circuit connected in parallel to the cell, discharge time, and a state of charge (SOC)-open circuit voltage (OCV) curve of the cell.

4. The management device according to claim 1, wherein the controller calculates an average voltage of the plurality of cells as the representative voltage by excluding a maximum voltage and a minimum voltage out of the voltages detected from the plurality of cells.

5. The management device according to claim 1, wherein the controller calculates the difference between the first voltage difference and the second voltage difference at each lapse of a predetermined time, compares each of the calculated differences with the threshold value, and when the difference is greater than or equal to the threshold value at N times or more, where N is an integer of 2 or more, in past x comparisons, where x is an integer of 2 or more, determines that the one cell to be detected is abnormal.

6. A power supply system comprising: the plurality of cells connected in series; and the management device that manages the plurality of cells connected in series according to claim 1.

* * * * *